United States Patent [19]

Young

[11] Patent Number: 5,776,803

[45] Date of Patent: Jul. 7, 1998

[54] MANUFACTURE OF ELECTRONIC DEVICES COMPRISING THIN-FILM CIRCUITRY ON A POLYMER SUBSTRATE

[75] Inventor: Nigel D. Young, Redhill, England

[73] Assignee: U.S. Philips Corporation, New York, N.Y.

[21] Appl. No.: 731,626

[22] Filed: Oct. 15, 1996

[30] Foreign Application Priority Data

Oct. 25, 1995 [GB] United Kingdom ............. 9521855

[51] Int. Cl.$^6$ .......................................... H01L 21/84
[52] U.S. Cl. .......................... 438/149; 438/164; 438/166;
            438/487; 438/795; 438/967
[58] Field of Search ........................... 438/149, 158,
        438/159, 160, 164, 166, 308, 487, 530,
        795, 799, 155, 183, 184, 200, 201, 967

[56] References Cited

U.S. PATENT DOCUMENTS

| | | | |
|---|---|---|---|
| 5,130,829 | 7/1992 | Shannon | 359/59 |
| 5,254,208 | 10/1993 | Zhang | 437/21 |
| 5,275,851 | 1/1994 | Fonash et al. | 437/233 |
| 5,346,850 | 9/1994 | Kaschmitter et al. | 437/81 |
| 5,456,763 | 10/1995 | Kaschmitter et al. | 136/258 |
| 5,514,466 | 5/1996 | Yamada et al. | 428/328 |
| 5,523,587 | 6/1996 | Kwo | 257/64 |

FOREIGN PATENT DOCUMENTS

| | | |
|---|---|---|
| 5-315361 | 11/1993 | Japan. |
| 5-326966 | 12/1993 | Japan. |

OTHER PUBLICATIONS

English language abstract 05-326042, Patent Abstracts of Japan, vol. 18, No. 141, Japanese Patent Application Kokai JP-A-05-326402.

English language Abstract 04-33213, Patent Abstracts of Japan, vol. 17 No. 178, Japanese Patent Application Kokai JP-A-04-332134.

*Primary Examiner*—Charles L. Bowers, Jr.
*Assistant Examiner*—Leon Radomsky
*Attorney, Agent, or Firm*—John C. Fox

[57] ABSTRACT

A method of manufacturing a large-area electronic device such as a flat panel display, which method includes subjecting a semiconductor film on a polymer substrate to an energy beam treatment, e.g., for crystal growth or to anneal an ion implant, and masking the substrate prior to treatment to prevent exposure to the energy beam, wherein the adhesion of the film and other layers on the substrate is improved by first heating the substrate to pre-shrink it, and then depositing the layers on the pre-shrunk substrate at a lower temperature than the heating temperature.

11 Claims, 4 Drawing Sheets

MANUFACTURE OF ELECTRONIC DEVICES COMPRISING THIN-FILM CIRCUITRY ON A POLYMER SUBSTRATE

BACKGROUND OF THE INVENTION

This invention relates to methods of manufacturing electronic devices comprising thin-film circuitry, in which a semiconductor film on a polymer substrate is subjected to an energy beam treatment (for example for crystal growth in the film) while masking the substrate against exposure. The device may be a large area image sensor, or a flat panel display (for example a liquid crystal display), or several other types of large-area electronic device (for example a thin-film data store or memory device, or a thermal imaging device). The invention also relates to the devices manufactured by such methods.

There is currently much interest in developing thin-film circuits with thin-film transistors (hereinafter termed "TFT"s) and/or other semiconductor circuit elements on inexpensive insulating substrates for large area electronics applications. These circuit elements fabricated with separate semiconductor islands of an amorphous or polycrystalline semiconductor film may form the switching elements in a cell matrix, for example in a flat panel display as described in U.S. Pat. No. 5,130,829 (our reference PHB 33646), the whole contents of which are hereby incorporated herein as reference material.

Recent developments involve the fabrication and integration of thin-film circuits (often using polycrystalline silicon) as, for example, integrated drive circuits for such a cell matrix. In order to increase the circuit speed, it is advantageous to use semiconductor material of good crystal quality and high mobility for thin-film islands of the TFTs of these circuits. However, it is often desirable to form TFTs of the matrix with less-crystalline material (typically amorphous silicon), so that these matrix TFTs have only low leakage currents. Instead of needing to deposit two semiconductor films of different crystallinity, it is known to form the area of higher crystallinity by exposing an area of a common film to an energy beam, usually from a laser. It is also known to use similar energy beam treatments for annealing implanted dopant in a semiconductor film in thin-film circuit manufacture. The semiconductor film can reach very high temperatures (e.g. in excess of 1200° C.) in these energy beam treatments.

For many of these large-area electronic devices it is becoming desirable to use polymer material as the substrate, for reasons of low cost, low weight and/or physical flexibility. However the energy beams which are used in the previously-described treatments and the very high semiconductor film temperatures which are attained may have an adverse effect on polymer material, for example in degrading its electrically insulating properties, and in physically ablating and even burning it.

The English language abstract 05-326402, Patent Abstracts of Japan, Vol 18, No 141, and the patent drawings of published Japanese Patent Application Kokai JP-A-05-326402 disclose a laser crystallisation treatment in which the semiconductor film is deposited on a thick ceramic or porous film on the polymer substrate, in order to avoid deformation and/or composition change. The ceramic or porous film comprises material such as MgO, $Al_2O_3$, $Cr_2O_3$, NiO, $ZrO_2$ and $UO_2$ which are deposited by laser abrasion and which are not commonly used in thin-film circuitry.

Another method for the manufacture of an electronic device comprising thin-film circuitry on a polymer substrate is disclosed in the English language Abstract 04-332134, Patent Abstracts of Japan, Vol 17 No 178 and in the patent drawings of published Japanese Patent Application Kokai JP-A-04-332134. A semiconductor film is patterned into separate islands at a surface of the polymer substrate. The semiconductor film is subjected to an energy beam treatment while masking the polymer substrate against exposure to the energy beam by means of a masking layer on a first insulating layer on said surface.

In this known method, the semiconductor film (6, in FIG. 2 of JP-A-04-332134) is patterned into the separate semiconductor islands (20,21) before the energy beam treatment. The masking layer (4) is located between these separate islands (20,21) which are formed on the first insulating layer (2) on the substrate surface. The masking layer (4) is of a reflective metal such as Al, Cr or Ta. Before the treatment step with energy beam (11), this metal layer is patterned to also form gate electrodes (3) for TFTs which are to be formed in the islands (20,21). A second insulating layer (5) is present on the masking layer during the energy beam treatment. This second insulating layer (5) is the gate dielectric film of the TFTs.

SUMMARY OF THE INVENTION

According to the present invention there is provided a method of manufacturing an electronic device comprising thin-film circuitry formed with separate semiconductor islands, in which a semiconductor film is patterned into the separate semiconductor islands at a surface of a polymer substrate, and in which the semiconductor film is subjected to an energy beam treatment while masking the polymer substrate against exposure to the energy beam by means of a masking layer on a first insulating layer on said surface, characterised by the steps of:

(a) pre-shrinking the polymer substrate by prolonged heating at a temperature below the maximum usable temperature for the polymer material of the substrate, (b) thereafter depositing sequentially the first insulating layer and the masking layer, the first insulating layer being deposited on the pre-shrunk polymer substrate at a lower temperature than the prolonged heating temperature of step (a), the masking layer being deposited on the first insulating layer as a continuous layer over the whole of said surface, (c) subjecting the semiconductor film to the energy beam treatment while the masking layer is present as the continuous layer over the whole of said surface of the polymer substrate, and (d) thereafter removing the masking layer and the first insulating layer from most of said surface of the polymer substrate except where the separate semiconductor islands of the semiconductor film are present.

The present invention is based on a recognition and solution by the present inventor of an adhesion problem with thin-film circuitry on polymer substrates. Thus, in work leading to the present invention, the present inventor has found that poor adhesion of the thin-film circuitry to a polymer substrate can result from stresses generated at the polymer surface by the type of layer structure which it is desirable to provide for adequate masking of the polymer substrate against the energy beam and against its heating effects and for adequate electrical insulation of the semiconductor islands. The inventor believes that most of the problematic stresses arise from the differential thermal expansion of the different materials of the polymer substrate and the masking and insulating layer structure.

These stresses are significantly reduced in accordance with the present invention by (i) pre-shrinking the polymer substrate by prolonged heating, (ii) depositing the first insulating layer on the pre-shrunk substrate at a lower temperature than the prolonged heating temperature, (iii) keeping the masking layer as a continuous layer while subjecting the semiconductor film to the energy beam treatment, and (iv) thereafter removing the masking and insulating layer structure from most of said surface of the polymer substrate except where the separate semiconductor islands of the semiconductor film are present. Removal of the insulating and masking layer structure from most of said surface of the substrate removes a major source of stress which could otherwise cause adhesion problems during subsequent temperature cycling in the manufacture of the device and in the operational life of the device. Depositing the first insulating layer at a lower temperature reduces the effect of differential thermal expansion (which produces strain in this layer) and so reduces the stress it imposes on its interface with the substrate. As will be described hereinafter, the insulating and masking layer structure can be formed using materials already commonly used in thin-film circuitry.

In one form, the semiconductor film itself is deposited on the first insulating layer to form the masking layer. Thus, according to one aspect of the present invention, there is provided a method of manufacturing an electronic device comprising thin-film circuitry formed with separate semiconductor islands, in which a semiconductor film is patterned into the separate semiconductor islands at a surface of a polymer substrate, and in which the semiconductor film is subjected to an energy beam treatment while masking the polymer substrate against exposure to the energy beam by means of the semiconductor film on a first insulating layer on said surface, characterised by the steps of:

(a) pre-shrinking the polymer substrate by prolonged heating at a temperature below the maximum usable temperature for the polymer material of the substrate, (b) thereafter sequentially depositing the first insulating layer and the semiconductor film on the polymer substrate, the first insulating layer being deposited at a lower temperature than the prolonged heating temperature of step (a), the semiconductor film being deposited as a continuous layer over the whole of said surface, (c) subjecting the semiconductor film to the energy beam treatment while the semiconductor film is present as the continuous layer over the whole of said surface of the polymer substrate, and (d) thereafter removing the semiconductor film and the first insulating layer from most of said surface of the polymer substrate except where the separate semiconductor islands are provided from the semiconductor film.

In order to adequately protect the polymer substrate in this first form of the method, the semiconductor film is kept continuous over the whole of said surface of the polymer substrate during the energy beam treatment step (c) and preferably has a thickness which is at least a thermal diffusion length larger than the absorption depth of the energy beam in the semiconductor material. In typical thin-film silicon material, the absorption depth for an ultraviolet excimer laser wavelength is typically less than 0.01 µm whereas a thermal diffusion length is an order of magnitude larger.

In some device processing sequences it can be desirable to form the islands before the energy beam treatment, for example when laser annealing dopant implanted regions. It can be desirable to form the islands from a thinner semiconductor film, for example about 0.05 µm or less. Furthermore, the present inventor finds that the first insulating layer deposited at a low temperature for stress reduction purposes may have poor electrical insulation properties, and that better electrical insulation may be needed below the semiconductor islands of the thin-film circuitry. These possible limitations of the first form of the method can be avoided in a second form of the method, by providing a separate masking layer below the semiconductor film.

Thus, according to a second aspect of the invention there is provided a method of manufacturing an electronic device comprising thin-film circuitry formed with separate semiconductor islands, in which a semiconductor film is patterned into the separate semiconductor islands at a surface of a polymer substrate, and in which the semiconductor film is subjected to an energy beam treatment while masking the polymer substrate against exposure to the energy beam by means of a masking layer on a first insulating layer on said surface, characterised by the steps of:

(a) pre-shrinking the polymer substrate by prolonged heating at a temperature below the maximum usable temperature for the polymer material of the substrate, (b) thereafter sequentially depositing the first insulating layer, the masking layer, a second insulating layer and the semiconductor film, the first insulating layer being deposited on the pre-shrunk polymer substrate at a lower temperature than the prolonged heating temperature of step (a), the masking layer being deposited as a continuous layer over the whole of said surface, and the second insulating layer being deposited on said continuous layer, (c) subjecting the semiconductor film to the energy beam treatment while the masking layer is present as the continuous layer over the whole of said surface of the polymer substrate, and (d) thereafter removing at least the second insulating layer and the masking layer from most of said surface of the polymer substrate except where covered by the separate semiconductor islands of the semiconductor film.

For stress reduction reasons, it is preferable to deposit also the masking layer and the second insulating layer at a lower temperature than the prolonged heating temperature of step (a). The first insulating layer may be deposited at a lower temperature than the second insulating layer, so as to minimise the stress at the substrate surface. In this case, the first insulating layer deposited at the lower temperature may have inferior electrical insulation properties than the second insulating layer; however it is on the second insulating layer that the semiconductor islands are located, and this second insulating layer deposited at a higher temperature may have very good electrical insulation properties.

From the standpoint of the quality of crystal growth in the semiconductor film, it is usually advantageous for the semiconductor film to have a thickness larger than the absorption depth of the energy beam in the semiconductor material and of the same order of magnitude as a thermal diffusion length in the semiconductor material. In this situation it is convenient to use an excimer laser to generate the energy beam. However, even in this situation, it is advantageous for the masking layer to extend as a continuous layer under the semiconductor film or islands during the energy beam treatment so that the stress arising from differential thermal expansion is uniform over the substrate surface and so that the underlying masking layer can protect the polymer substrate where a pin-hole defect may be present in the semiconductor film or islands.

Although the masking layer may be of metal (e.g. chromium, tantalum, aluminium, tungsten, molybdenum, silver or titanium) which reflects the incident energy beam in step (b), great care is then needed in the design of the equipment so as to ensure that the reflected beam is not reflected back again by the equipment onto the semiconductor film. Such back reflections may result in local overexposure, so causing local hot-spots in the semiconductor film or islands and in the masking layer. For this reason it is advantageous to avoid the use of reflective masking layers and to maximise absorption of the incident beam in the masking layer. This can be readily achieved when the masking layer is of a semiconductor material which absorbs the incident energy beam and has a thickness larger than the absorption depth of the energy in the in the semiconductor material. A further advantage of using a semiconductor masking layer is that it may be deposited in the same reactor run as the insulating layers and semiconductor film which are sequentially deposited. In order to reduce its strain, this semiconductor masking layer may be deposited at a lower temperature than the subsequent deposition temperature of the semiconductor film.

Areas of the semiconductor masking layer may become very hot (for example in excess of 1200° C.) in absorbing the incident energy beam, and so preferably the first insulating layer is optimised to act as a thermal barrier to protect the polymer substrate from being heated in this situation. Generally, the first insulating layer may serve as a diffusion barrier, by masking the polymer substrate against adverse effects of heat diffusion and/or of impurity diffusion from the overlying layers and film.

The first and second insulating layers may be of a variety of insulating materials already used in thin-film circuit technology, for example, silicon oxide and/or silicon nitride, and/or silicon oxy-nitride.

The semiconductor film may be a continuous film over the said surface of the polymer substrate during the energy beam treatment step (b), and areas of the semiconductor film may be etched away to form the separate semiconductor islands after the energy beam treatment step (b). However, an insulating and masking layer structure provided in accordance with the present invention is also suitable for protecting the polymer substrate with pre-formed islands, i.e. when areas of the semiconductor film are etched away to form the separate semiconductor islands before the energy beam treatment step (b).

BRIEF DESCRIPTION OF THE DRAWINGS

These and other features in accordance with the present invention, and their advantages, are illustrated specifically in embodiments of the invention now to be described, by way of example, with reference to the accompanying diagrammatic drawings, in which.

It should be understood that the cross-sectional views of FIGS. 2 to 6 and 8 and 9 are diagrammatic and not drawn to scale. Relative dimensions and proportions of parts of these cross-sectional views have been shown exaggerated or reduced in size for the sake of clarity and convenience in the drawings. The same reference signs are generally used to refer to corresponding or similar features in different embodiments.

DETAILED DESCRIPTION OF THE PREFERRED EMBODIMENTS

FIGS. 1 to 6 illustrate stages in the manufacture of a large-area electronic device comprising thin-film circuitry formed with separate semiconductor islands 1a, 1b. In this method a semiconductor film 1 is patterned into the separate semiconductor islands 1a, 1b (see FIG. 4) at a surface 15 of a polymer substrate 10. The semiconductor film 1 is subjected to a treatment with an energy beam 20 (in FIG. 3) and/or an energy beam 30 (in FIG. 4), while masking the polymer substrate 10 against exposure to the energy beam 20,30 by means of a masking layer 13 on a first insulating layer 11 on said surface 15.

Figure 3:
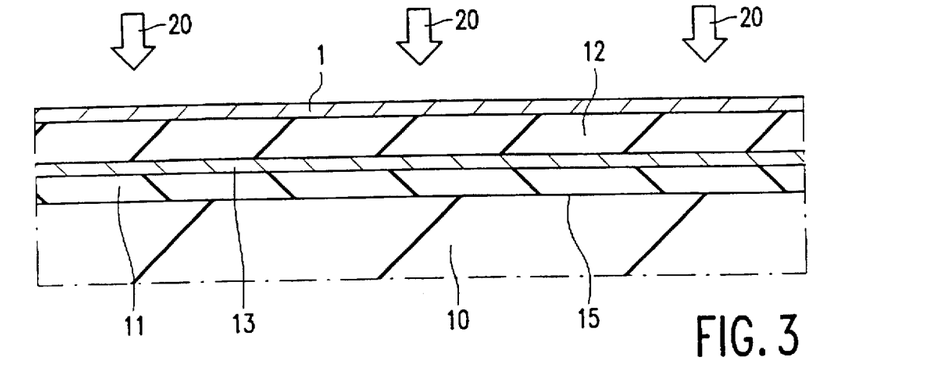
Figure 4:
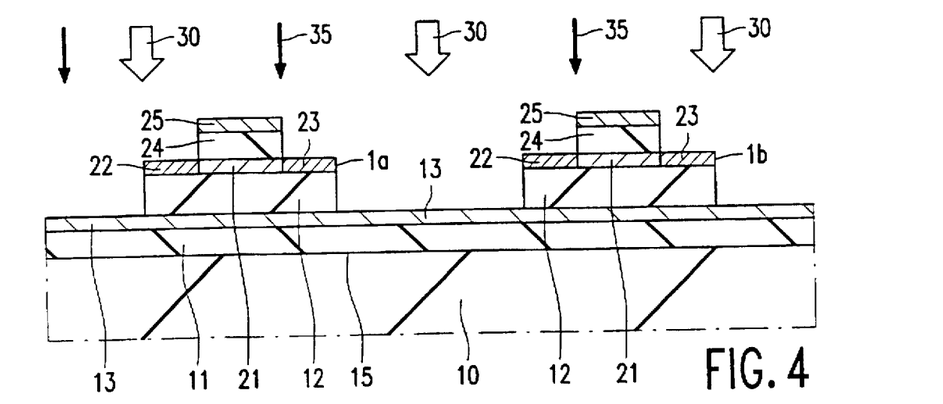
Figure 5:
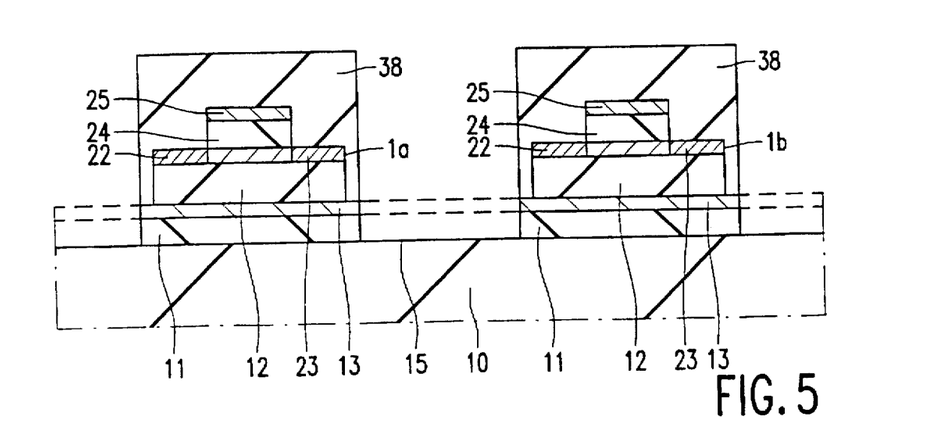

Such a method in accordance with the present invention is characterised by the steps of:

a) pre-shrinking the polymer substrate 10 by prolonged heating at a temperature below the maximum usable temperature for the polymer material of the substrate 10 (see FIG. 1), b) thereafter, sequentially depositing the first insulating layer 11, the masking layer 13, a second insulating layer 12 and the semiconductor film 1 on the preshrunk polymer substrate 10 (see FIGS. 2 and 3), the first insulating layer 11 being deposited at a lower temperature than the prolonged heating temperature of step (a), the masking layer 13 being deposited as a continuous layer over the whole of the substrate surface 15, and the second insulating layer 12 being deposited on said continuous masking layer 13, c) subjecting the semiconductor film 1, 1a, 1b to the energy beam treatment 20,30 while the masking layer 13 is present as a continuous layer over the whole of said surface 15 of the polymer substrate 10 (see FIGS. 3 and 4), and d) thereafter removing the second insulating layer 12, the masking layer 13, and the first insulating layer 11 from most of said surface 15 of the polymer substrate 10 except where covered by the separate semiconductor islands 1a and 1b of the semiconductor film 1 (see FIG. 5).

Such a method in accordance with the present invention reduces the strain produced in the insulating and masking layer structure 11 to 13 adjacent to the polymer substrate 10 and reduces the stress generated at the substrate surface 15 by what remains of the layer structure 11 to 13 after step (d). In this way the adhesion of the semiconductor islands 1a and 1b to the polymer substrate 10 is significantly improved.

A specific example of such an embodiment will now be described with reference to FIGS. 1 to 6. In this specific example, the thin-film circuitry comprises thin-film transistors (TFTs) of the so-called "self-aligned" type, in which source and drain electrode regions 22 and 23 are formed in the semiconductor islands 1a and 1b together with the channel regions 21 of the TFTs (see FIGS. 4 to 6). These source and drain electrode regions 22 and 23 are most conveniently formed by a dopant ion implantation 35, after which an annealing treatment may be carried out with a laser beam 30 to activate the implanted dopant (FIG. 4). The channel regions 21 of these TFTs comprise high-mobility polycrystalline material which is formed by crystal growth using a laser beam 20 (FIG. 3). Thus, this specific example utilises two energy beam treatments. Although FIGS. 3 and 4 illustrate the energy beam 20 and the energy beam 30 by several arrows, it should be understood that the beam 20 is a single beam and the beam 30 is a single beam, both of which beams are scanned along the substrate 10. Typically, the width of these single energy beams 20 and 30 may be of the order of $10^4$ μm, i.e about 1 cm.

For the most part, the TFTs of the thin-film circuitry have individual semiconductor islands 1a and 1b. Typically these TFT islands 1a and 1b may have lateral dimensions of, for example, about 30 μm×30 μm. The width of the spacings between these individual islands 1a and 1b may be typically, for example, 5 to 10 μm. In a typical large-area electronic device the silicon islands 1a and 1b may cover less than 50% (for example between 1% and 25%) of the total surface 15 of the polymer substrate 10. However, the stress reduction in accordance with the present invention permits the use of even greater circuit densities on the substrate surface 15.

The large-area electronic device being manufactured may comprise, for example, a flat panel display having a thin-film cell matrix similar to the described in U.S. Pat. No. 5,130,829 and having integrated thin-film drive circuitry on the same substrate 10. Alternatively, the device may comprise a large-area image sensor or a data store or memory device. Device substrate 10 may be formed of a variety of commercially available polymer materials. The polymer substrate 10 may be a self-supporting polymer film, or it may be a thick polymer coating on an underlying support of another material.

Polyimide is one popular polymer material for the substrate 10 of a large-area electronic device. The maximum usable temperature for polyimide is generally about 300° C. The maximum usable temperature for a polymer material refers to the maximum sustained temperature at which the polymer material can be held for a prolonged period and retain its polymer characteristics, for example its flexibility and electrically insulating properties.

Examples of other suitable polymer materials which may be used for the

| Polyethersulphone | (PES) | 220° C. |
|---|---|---|
| Polyacrylate | (PAR) | 180° C. |
| Polyetherimide | (PEI) | 170° C. |
| Polyethyelenenapthalate | (PEN) | 150° C. |
| Polyethyeleneterepthalate | (PET) | 130° C. |

Adhesion between the polymer substrate 10 and the thin-film circuitry formed thereon is adversely affected by stress between the polymer substrate 10 and the overlying layer structure 11, 13, 12 and 1. The most adverse effects (in the absence of the present invention) may potentially come from (i) the prolonged heating and subsequent cooling of the substrate 10 during the deposition of the overlying layer structure 11, 13, 12 and 1 and (ii) the transient beam heating of the semiconductor film 1 and masking layer 13 during the energy beam treatments. The potential problems with the deposition step arise because the layer structure 11, 13, 12 and 1 when deposited is continuous over the whole of the substrate surface 15 during this deposition time (typically in excess of an hour) and the substrate temperature at some stages in this deposition sequence may come close to the maximum usable temperature of the polymer. The potential problems with the energy beam treatments arise because the temperature of the semiconductor film and masking layer when exposed to the beam may be approaching an order of magnitude greater than the maximum usable temperatures of the polymer substrate 10 and the deposition temperatures of the layer structure 11, 13, 12 and 1, and once again there is a continuous layer structure (at least 11 and 13) over the whole substrate surface 15. The present invention significantly reduces these stresses.

Before sequentially depositing the films 11, 13, 12 and 1, the polymer substrate 10 is pre-shrunk by heating for a prolonged period to a temperature which is higher than the deposition temperature of the first insulating layer 11 but which is lower than the maximum usable temperature for the polymer.

Figure 1:
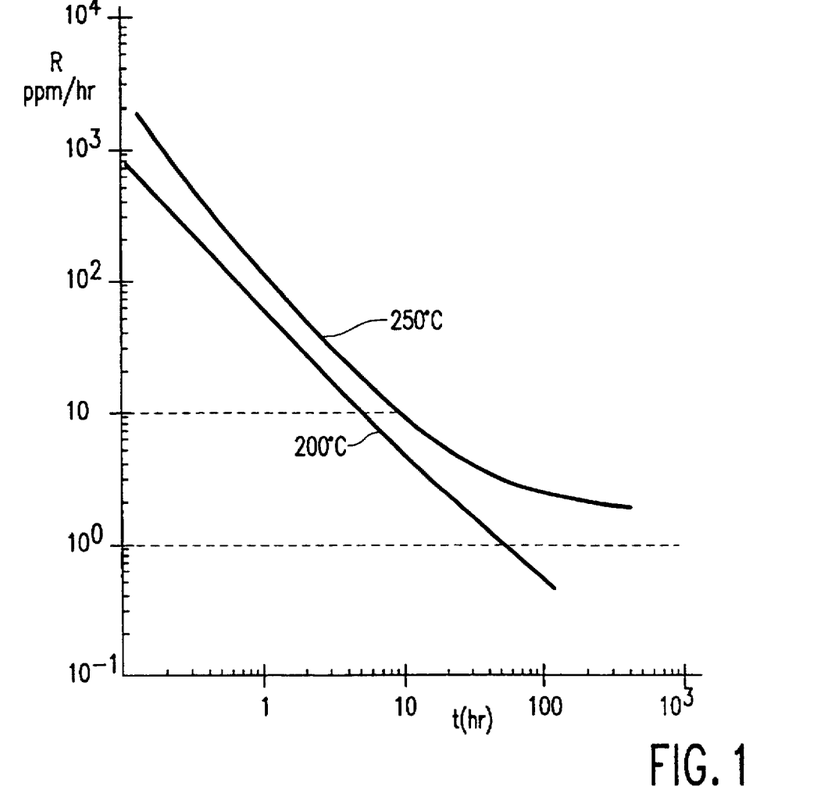
FIG. 1 is a graph of the polymer substrate shrinkage rate R in ppm per hour against anneal time in hours, for substrates annealed at 200° C. (degrees Celsius) and 250° C.

Preferably this prolonged heating of the substrate 10 is at a temperature comparable to the maximum sustained temperature that the substrate 10 experiences during the subsequent manufacturing steps (b) and (c) before the layer structure 11 to 13 is removed from most of the surface 15. The two curves 200° C. and 250° C. of FIG. 1 illustrate two specific examples of such a pre-shrink treatment on two samples of a polyimide substrate 10 for a time t (in hours) at 200° C. and 250° C. respectively. The shrinkage rate R in ppm (parts per million) per hour shows the rate at which the polyimide substrate 10 becomes more compacted with heating time t at the sustained annealing temperature 200° C. or 250° C. All the dimensional changes in the samples were measured after cooling again to room temperature (20° C.), i.e. they were not measured at the heating temperatures (200° C. and 250° C.), and so dimensional changes associated with thermal expansion of the polyimide substrate are not included in FIG. 1.

Thus, when first heated to 200° C. and 250° C. respectively, the polyimide substrates 10 of FIG. 1 started to shrink at the rate of about 700 ppm per hour and 2000 ppm per hour respectively. With a substrate surface 15 having transverse dimensions of 25 cm, such a dimensional change of $10^3$ ppm corresponds to 250 μm, which (ignoring all other factors, including the present invention) could introduce a significant strain between the substrate 10 and an overlying layer structure deposited for one hour at this temperature. The shrinkage rate falls to about 10 ppm per hour after annealing for between 5 and 10 hours at 200° C. and for about 10 hours at 250° C. With surface dimensions of 25 cm, a dimensional change of 10 ppm corresponds to 2.5 μm. Preferably the annealing treatment is continued for an even longer period in order to reduce further the potential strain due to such dimensional changes during subsequent processing and to permit the use of even larger substrate surfaces 15, for example with transverse dimensions of 0.5 m and even 1.0 m. Thus, the rate R falls to below 1 ppm per hour (i.e. 1 μm in 1.0 m) after about 50 hours of prolonged heating at 200° C. The annealing treatment at 250° C. was less effective than that at 200° C., because the rate R levelled off at about 2 ppm per hour. Thus, in this specific example of polyimide material, the substrate 10 may be most advantageously pre-shrunk by heating at 200° C. for about 100 hours. This brings the shrinkage rate to well below 1 ppm per hour.

Figure 2:
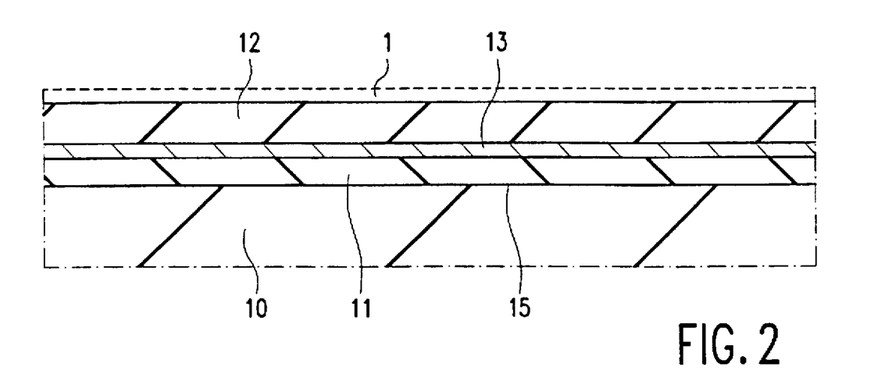
FIGS. 2 to 6 are cross-sectional views of part of an electronic device structure on a pre-shrunk substrate at successive stages in its manufacture by a method in accordance with the present invention.

Before depositing the semiconductor film 1 and forming the semiconductor islands 1a and 1b, the insulating and masking layer structure 11 to 13 is formed on the pre-shrunk polymer substrate 10 as illustrated in FIG. 2. The layer structure 11 to 13 may be deposited by known plasma-enhanced chemical vapour deposition (PECVD) processes at low temperatures, for example between 100° C. and 200° C., after initially cleaning the substrate surface in known manner for the deposition.

The layer structure 11 to 13 of FIG. 2 may be formed with silicon oxide and/or nitride as the insulating material for layers 11 and 12 and with silicon as an absorbent masking material for the layer 13. With a polymer substrate 10 of polyimide or PES material, the insulating layer 11 may be deposited at a temperature in the range of 100° C. to 200° C. and to a thickness of, for example about 0.2 μm. The deposition temperature is determined by the temperature of a heated base plate on which the substrate 10 is mounted in the deposition reactor. The base plate with its substrate 10 may be moved between different reaction chambers in the reactor so that the layers 11,13,12 and film 1 are deposited sequentially in the same operational run of the reactor, without exposing the substrate 10 to the outside ambient between the depositions. The silicon masking layer 13 may be deposited at a temperature in the range of 100° C. to 200° C. (or to 250° C. in the case of a polyimide substrate 10 pre-shrunk at 250° C.) and to a thickness of, for example, about 0.1 μm. Using low temperatures for the deposition of the layers 11 and 13 reduces their strain arising from their thermal expansion mismatch with the substrate 10, and so reduces the stress which they exert on the polymer substrate surface 15. However, the insulating layer 11 deposited at a temperature in the range of 100° C. to 150° C. may have poor electrical insulation properties due to being more porous and possibly having a higher $H_2O$ content. These factors however have less effect on the thermal insulation properties of the layer 11. In order to obtain good quality electrical insulation properties for the second insulating layer 12, the layer 12 may be deposited at a higher temperature, for example at least 200° C. and even to 250° C. in the case of a polyimide substrate 10. The layer 12 may have a larger thickness than the layer 11. Thus, it is advantageous for the insulating layer 11 adjacent to the polymer substrate 10 to have a small thickness in order to reduce further the stress at the substrate surface 15. The choice of particular thicknesses t for the insulating layers 11 and 12 will be described subsequently with reference to FIG. 7.

The silicon film 1 for the thin-film circuit elements is then deposited in known manner over the layer structure 11 to 13 on the polymer substrate 10. The film 1 may be deposited as amorphous silicon material by a plasma-enhanced chemical vapour deposition (PECVD) process at a low temperature, for example between 100° C. and 250° C. Typically, the resultant silicon film 1 has a hydrogen content, i.e it is generally known as α-Si:H. The thickness of the silicon film 1 is typically less than 0.1 μm, for example about 0.05 μm or less. The silicon material of the masking layer 13 may be deposited at a lower temperature than the silicon film 1 so as to reduce the strain in the layer structure 11 to 13, and the silicon masking layer 13 may have a larger thickness than the silicon film 1 so as to be a better absorber of the energy beams 20 and 30.

FIG. 3 illustrates the laser treatment stage used to crystallise at least a portion of the silicon film 1. The energy beam 20 may be a pulsed laser beam of an ultra-violet wavelength generated by an excimer laser. A laser beam 20 of ultra-violet wavelength has the known advantage of permitting control of its absorption depth in the semiconductor material of the film 1 and/or the film 13. The silicon film 1 has a thickness larger than the absorption depth of the beam 20 in this material, but slightly less than a thermal diffusion length. The thickness of the silicon masking layer 13 is larger than a thermal diffusion length and provides an effective mask for the polymer substrate 10 for any of the laser light passing through the film 1, for example at a pin-hole in the film.

In a specific example of the laser crystallisation treatment of FIG. 3, a 248 nm wavelength from a pulsed KrF laser may be used, with an incident laser energy on the film 1 in the range of 100 to 300 mJ.cm$^{-1}$ per pulse. The pulse duration may be of the order of nanoseconds. A single pulse exposure could be used for crystallisation of the film 1, or exposure to multiple pulses (for example, five or ten such pulses) may be used. By this laser treatment of FIG. 3, the amorphous silicon material of the film 1 is converted to polycrystalline silicon material. The polycrystalline material may typically have a crystal grain size of 0.1 to 0.3 μm. The electron field-effect mobility through this polycrystalline material in n-channel TFTs may be typically, for example, in the range of 50 to 200 $cm^2.V^{-1}.s^{-1}$.

During the FIG. 3 exposure to the laser beam 20, the exposed silicon film 1 may be molten through most of its thickness. The molten silicon is at a temperature of approximately 1250° C. The first and second insulating layers 11 and 12 act as thermal barriers to protect the polymer substrate 10 from being heated in this laser beam treatment step of FIG. 3.

Figure 7:
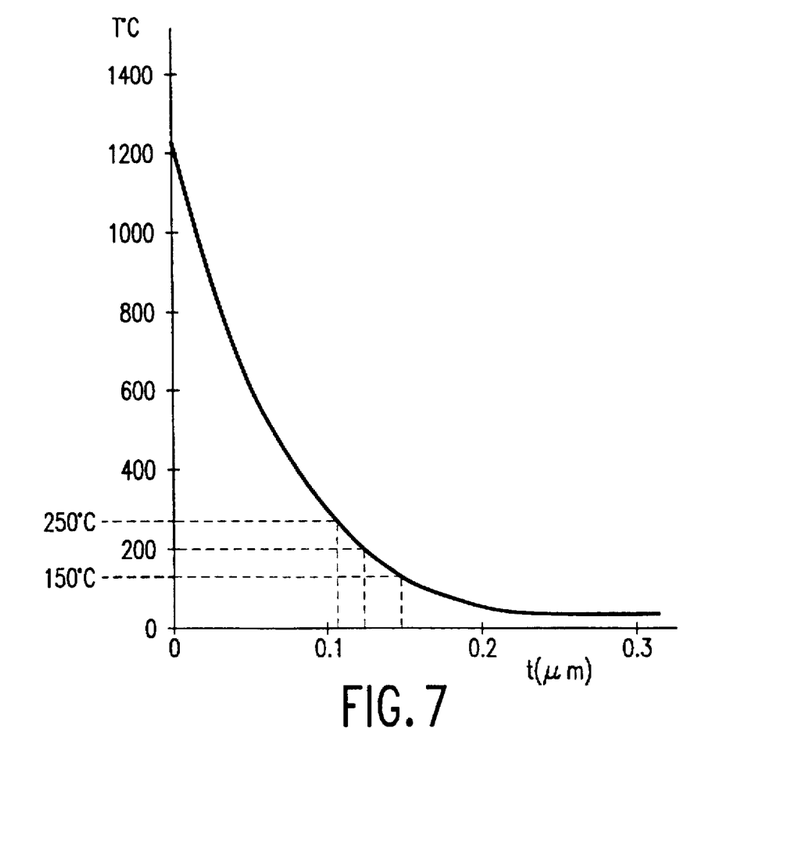
FIG. 7 is a graph of the silicon film temperature T in °C. against the thickness t in μm (micrometers) of an insulating layer.

FIG. 7 illustrates the decrease in temperature across the thickness t of an insulating layer 11 and/or 12, with laser pulses 20 of 20 nanoseconds duration or less. As can be seen from FIG. 7, a thickness of about 200 nm of silicon oxide reduces the temperature T from above 1200° C. to about the general ambient temperature, i.e less than 50° C. The polymer substrate 10 is therefore extremely well protected from heat degradation in the situation illustrated in FIG. 3.

In this FIG. 3 situation, the silicon film 1 is a continuous film over the whole surface 15 of the polymer substrate 10, i.e the islands 1a and 1b are not formed until a later stage in manufacture. The 0.3 μm thick insulating layer 12 acts as a good thermal barrier below the silicon film 1, except where the silicon film 1 may include a pin-hole or other defect transmitting the laser beam 20. Except at such defect areas, the temperature of the bottom insulating layer 11 below the molten silicon film 1 remains lower than the temperature at which the layer 11 was deposited, and so there is no increased strain of the insulating layer 11 below the silicon film 1. Where such defects are present in the film 1, the laser beam 20 is now absorbed in the underlying silicon masking layer 13. Although the laser beam 20 in these defect areas may locally melt the upper part of the silicon masking layer 13, the 0.2 μm thick insulating layer 11 and the unmelted lower part of the silicon layer 13 act as a good thermal barrier to protect the underlying polymer substrate 10. Thus, although the film 1 and possibly the layer 13 are heated by the beam 20 to a temperature very much higher than the pre-shrink annealing temperature (200° C. or 250° C. of FIG. 1), the insulating layers 11 and 12 each act as thermal barriers to maintain the temperature of the substrate 10 below this annealing temperature.

After the crystal growth step illustrated in FIG. 3, the substrate 10 is dried and a photolithographic and etching step is carried out to divide the silicon film in known manner into the separate islands 1a and 1b for each circuit element. In the case of TFTs, an insulated gate structure 24,25 is now formed in known manner on each silicon island 1a and 1b. The insulated gate structure 24,25 comprises a gate electrode 25 on a dielectric film 24. During the photolithographic and etching stage used to define the pattern of the insulated gate structure 24,25, the insulating layer 12 may be etched away from between the islands 1a and 1b.

In the case of a self-aligned TFT, this insulated gate structure 24,25 may now be used in known manner as an implantation mask to mask the underlying channel region 21 against an implantation of dopant ions 35 used to form the source and drain electrode regions 22 and 23. The dopant ions 35 may be of phosphorus or arsenic in the case of an n-channel TFT. The implanted dopant ions in the film regions 22 and 23 are activated by a subsequent laser annealing treatment. For the sake of convenience, FIG. 4 illustrates both the laser annealing treatment with the laser beam 30 and the ion implantation with the dopant ions 35. However, it will be appreciated by a person skilled in the art that the device structure is removed from the implantation equipment after implanting the ions 35 and is then moved to a laser treatment station for exposure to the laser beam 30.

The laser treatment illustrated in FIG. 4 differs from that illustrated in FIG. 3, both in respect of the film/layer structure 1,11 to 13 and in respect of the energy conditions of the beams 20 and 30. Thus, the silicon film I in FIG. 3 is a continuous film over the whole surface 15 of the substrate 10, whereas areas of the film 1 have been etched away to form the separate silicon islands 1a and 1b before the laser treatment of FIG. 4. In this FIG. 4 situation, the laser beam 30 exposes the silicon masking layer 13 at the areas between the silicon islands 1a and 1b. Thus, the silicon masking layer 13 acts as the primary absorbing layer for the laser beam 30 in these areas. The bottom insulating layer 11 now acts as the primary thermal diffusion barrier protecting the polymer substrate 10 in these areas. However, the energy of the beam 30 used for annealing an implant as in FIG. 4 is generally less than that of the beam 20 used for crystal growth as in FIG. 3. Thus, although some melting will occur in the laser absorbing areas of the silicon masking layer 13 and of the silicon islands 1a and 1b, the melt depth will generally be less than it was in the silicon film 1 in FIG. 2.

In a specific example with a thickness of 0.1 µm for the silicon layer 13 and 0.2 µm for the insulating layer 11, the polymer substrate 10 in the areas between the islands 1a and 1b is protected against heat degradation by the thermal barrier provided by the bottom insulating layer 11 and the lower unmelted part of the silicon masking layer 13. Although the bottom insulating layer 11 was deposited at a lower temperature than the insulating layer 12, its thermal insulating properties are generally not significantly poorer than those of the layer 12. A thickness of 0.2 µm for the insulating layer 11 and the unmelted thickness of the silicon masking pattern 13 is normally sufficient to maintain the substrate surface 15 in the areas between the islands 1a and 1b at a temperature below 150° C., and hence below the annealing temperature used to pre-shrink the substrate 10.

The laser treatment illustrated in FIG. 4 is the final laser treatment during the manufacturing process for this device. Therefore, as illustrated in FIG. 5, the insulating and masking layer structure 11 to 13 is now etched away from most of the substrate surface 15 except where covered by the islands 1a and 1b. After drying the substrate 10, this etch definition is effected using a photolithographic and etching process, in which the TFT structures of the islands 1a and 1b are masked against the etching by a photoresist pattern 38. The areas of the masking layer structure 11 to 13 which are left on the polymer substrate 10 form platforms or pedestals which support the TFT islands 1a and 1b.

It should be noted that in the scenario illustrated in FIG. 4, at least the upper part of the silicon masking layer 13 where not covered by the silicon islands 1a and 1b is heated to a temperature well above the deposition temperature for the layer 13. This heating by the energy beam 30 introduces strain into the silicon masking layer 13 and into the insulating layer 11 where not covered by the silicon islands 1a and 1b. Compositional change of the layers 11 and 13 in these areas may also result from this heating. However, it should be noted that these strained areas of the layers 11 and 13 are removed in the platform/pedestal definition step illustrated in FIG. 5, and so they are not retained in the final device structure.

Figure 6:
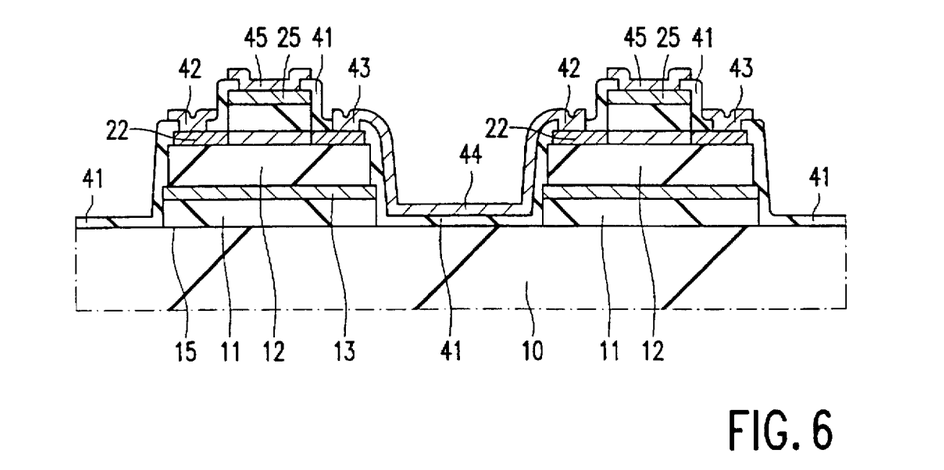

The fabrication of the thin-film circuit elements is now completed in further processing steps. Thus, for example, an insulating layer 41 may be deposited over the island structure 1a and 1b on the pedestals 11 to 13 on the polymer substrate 10. After drying the substrate 10, a photolithographic and etching process is effected to form contact windows in this insulating layer 41 over the gate electrodes 25 and the source and drain electrode regions 22 and 23 of the TFTs. A metal film may then be deposited and patterned in a photolithographic and etching process to form connections and interconnections 42 to 45 for the individual circuit elements. An example of the resulting structure is illustrated in FIG. 6. Because the insulating layer 41 is deposited in one of the final manufacturing steps, it is not subject to the temperature cycling associated with the multiple film deposition, laser crystallisation, doping and laser anneal steps, the continuous layer 41 may therefore have adequate adhesion to those areas of the polymer substrate 10 with which it is in contact. However, if desirable due to subsequent temperature changes in manufacture or operational life, special measures may be taken to improve the adhesion. Thus, for example, the insulating material for the layer 41 may be laid down at a low temperature and/or, after forming the FIG. 6 structure with the metal pattern 42 to 45, the areas of the layer 41 not covered by the connections/interconnections may be etched away from the areas of the substrate 10 between the pedestals 11 to 13.

The final TFT structure is preferably subjected to a hydrogenation treatment to passivate the polycrystalline silicon islands 1a and 1b, for example by heating to near the maximum usable temperature of the polymer (300° C. for polyimide) for about 1 hour in a hydrogen atmosphere. Although this treatment may involve the substrate 10 being heated to a higher temperature than its pre-shrink annealing temperature (200° C. or 250° C. in FIG. 1), there is no-excessive stress generation in the film 1 and layer structure 11 to 13, which are already sub-divided. Thus, the sub-divided parts can move with respect to each other to accommodate the thermal expansion. Furthermore, abrupt temperature changes can be avoided in this hydrogenation treatment by appropriately ramping the device temperature up to and from the hydrogenation temperature.

Figure 8:
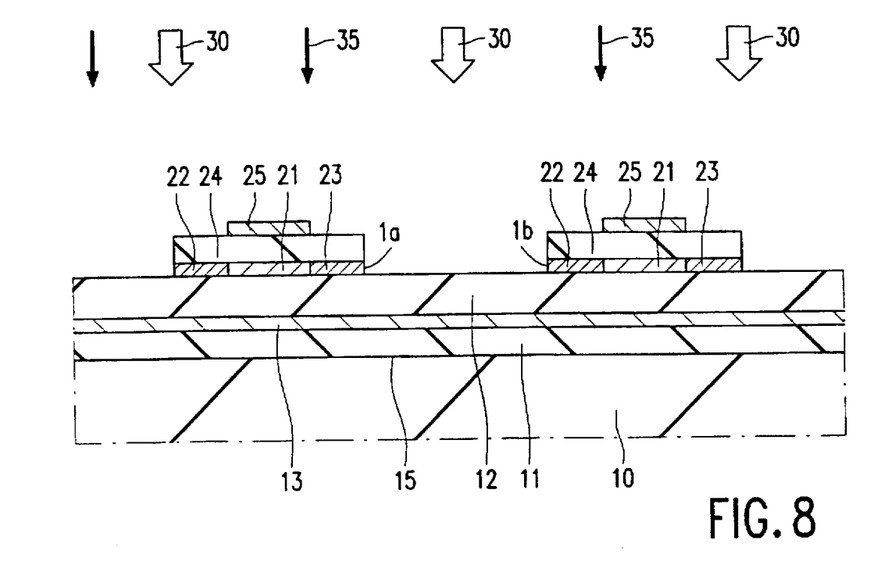
FIGS. 8 and 9 are cross-sectional views similar to FIGS. 2 to 6, illustrating two different modifications also in accordance with the present invention.

It will be evident that many modifications and variations are possible within the scope of the present invention. In defining the pattern of the insulated gate structure 24,25 in FIG. 4, the gate dielectric 24 was etched away from the areas where the implanted source and drain regions 22 and 23 were to be formed and the insulating layer 12 was etched away from between the islands 1a and 1b. FIG. 8 illustrates a variation in which these areas of the insulating layers 12 and 13 are not etched away but are retained for the dopant implantation 35 and the laser anneal 30. They are removed subsequently in fabricating the final device structure illustrated in FIG. 6. FIG. 3 illustrates a crystal growth stage using a laser beam 20 on a continuous silicon film 1. However, areas of the film 1 may be removed to form the separate islands 1a and 1b before the crystal growth stage of FIG. 3. In this case, it can be advantageous to increase the thickness of the bottom insulating layer 11.

The embodiment of FIGS. 2 to 6 involves two laser treatments, namely a crystal growth treatment with laser beam 20 in FIG. 3 and an implant annealing treatment with laser beam 30 in FIG. 4. Embodiments involving only one such treatment are also possible in accordance with the invention. Thus, for example, by omitting the crystal growth treatment of FIG. 3, self-aligned TFTs may be formed with an amorphous silicon channel region 21 and with implanted source and drain regions 22 and 23, these regions 22 and 23 being annealed by laser beam 30 as in FIG. 4. The implant anneal treatment of FIG. 4 is not used for TFTs having source and drain regions 22 and 23 formed by additionally deposited doped films, but these TFTs may have a polycrystalline silicon channel region 21 formed by the crystal growth treatment of FIG. 3 with laser beam 20.

Figure 9:
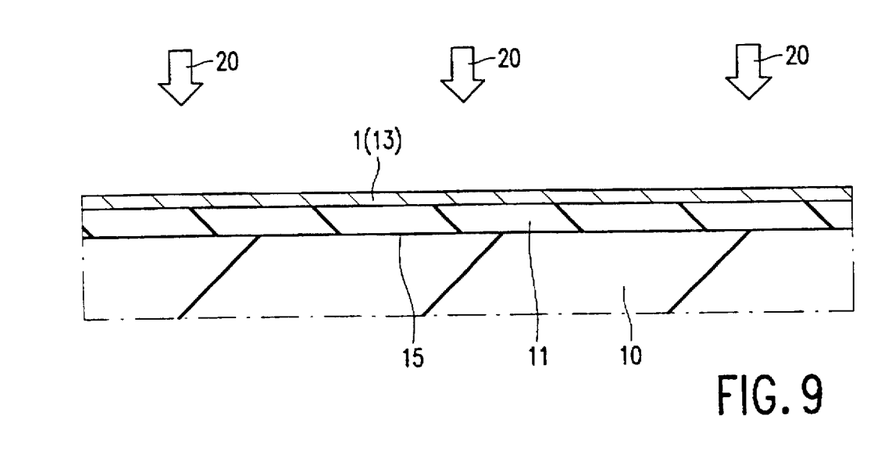

In the embodiments illustrated in FIGS. 2 to 6 and FIG. 8, a separate masking layer 13 is used in addition to the semiconductor film 1. This provides a very effective and versatile masking arrangement. FIG. 9 illustrates an alternative arrangement in which the semiconductor film 1 itself is deposited on the first insulating layer 11 to form the masking layer. Thus, according to this aspect of the present invention, there is provided a method of manufacturing an electronic device comprising thin-film circuitry formed with separate semiconductor islands 1a and 1b, in which the semiconductor film 1 is subjected to an energy beam treatment while masking the polymer substrate 10 against exposure to the energy beam 20 by means of the semiconductor film 1 itself, on a first insulating layer 11 on the surface 15 of the polymer substrate 10. This method comprises the steps of:

(a) pre-shrinking the polymer substrate by prolonged heating at a temperature below the maximum usable temperature for the polymer material of the substrate, in a manner similar to that of FIG. 1;

(b) thereafter sequentially depositing the first insulating layer 11 and the semiconductor film 1 on the polymer substrate 10, the first insulating layer 11 being deposited at a lower temperature than the prolonged heating temperature of step (a), the semiconductor film 1 being deposited as a continuous layer over the whole of said surface;

(c) subjecting the semiconductor film 1 to the energy beam treatment while the semiconductor film 1 is present as the continuous layer over the whole of said surface of the polymer substrate 10 as illustrated in FIG. 9; and (d) thereafter removing the semiconductor film and the first insulating layer 11 from most of said surface of the polymer substrate except where the separate semiconductor islands 1a and 1b are provided from the semiconductor film 1.

In order to adequately protect the polymer substrate 10 in this FIG. 9 form of the method, the semiconductor film 1 is kept continuous over the whole of the surface 15 of the polymer substrate during the energy beam treatment step (c) of FIG. 9 and preferably has a thickness larger than the thermal diffusion length in the semiconductor material. Thus, a silicon film 1 in the FIG. 9 embodiment may be, for example 0.1 µm thick, and the layer 11 may be, for example, 0.3 µm thick.

In the embodiments so far described with reference to FIGS. 2 to 9, a laser was used to generate the energy beams 20 and 30. A laser beam 20 is particularly convenient for controlling the crystallisation and heating conditions. However, other forms of energy beam (for example an electron beam or high-power lamp radiation) may be used for crystal growth in the FIG. 3 or 9 stage and/or especially for implantation annealing in the FIG. 4 or 8 stage. Thus, the energy beam treatments of FIGS. 3, 4, 8 and 9 may be effected by a short-duration exposure to very high intensity lamps, while the insulating and masking layer structure 11 to 13 protects the polymer substrate 10.

The fabrication of polycrystalline silicon self-aligned TFTs has been described with respect to FIGS. 4 to 6 and FIG. 8. However, it will be evident that other types of thin-film circuit elements may be fabricated with silicon islands formed from the silicon film 1. Thus, for example, instead of forming the source and drain electrode regions 22 and 23 in the silicon islands 1a and 1b, the source and drain electrode regions 22 and 23 may be formed by doped films deposited on the undoped silicon islands 1a and 1b. In this case TFTs of the so-called "co-planar" type may be formed. TFTs of the so-called "staggered" type may also be fabricated, in which case the source and drain electrode regions 22 and 23 are formed by doped semiconductor films deposited on the insulating layer 12 before the silicon film 1. The present invention may also be used in the fabrication of TFTs of the so-called "inverted, staggered" type, in which the insulated gate structure 24,25 is formed on the insulating layer 12 before deposition of the semiconductor film 1, and the source and drain regions 22 and 23 are formed by doped semiconductor films on the islands 1a and 1b.

Although both the islands 1a and 1b shown in FIG. 4 are of polycrystalline silicon material grown in the crystallisation stage of FIG. 3, it will be evident that the laser exposure of FIG. 3 may be localised to selected areas of the film 1. In this case the amorphous silicon material is retained in the non-selected areas, so that amorphous silicon TFTs may be formed in these non-selected areas. Thus, the device may comprise both polycrystalline silicon TFTs and amorphous silicon TFTs.

It will also be evident that thin-film circuit elements other than TFTs may be fabricated in the device. Thus, for example, silicon thin-film diodes may be formed, for example in amorphous silicon islands. These diodes may be of, for example, the so-called "α-Si:H PIN" type having an undoped (intrinsic) film sandwiched between a p-type doped film and an n-type doped film. Such diodes may form, for example, pixel photodiodes of a large-area image sensor.

From reading the present disclosure, other variations and modifications will be apparent to persons skilled in the art. Such variations and modifications may involve equivalent and other features which are already known in the design, manufacture and use of electronic devices comprising thin-film circuits, semiconductor devices, and component parts thereof, and which may be used instead of or in addition to features already described herein. Although Claims have been formulated in this Application to particular combinations of features, it should be understood that the scope of the disclosure of the present invention also includes any novel feature or any novel combination of features disclosed herein either explicitly or implicitly or any generalisation thereof, whether or not it relates to the same invention as presently claimed in any Claim and whether or not it mitigates any or all of the same technical problems as does the present invention. The Applicants hereby give notice that new Claims may be formulated to such features and/or combinations of such features during the prosecution of the present Application or of any further Application derived therefrom.

I claim:

1. A method of manufacturing an electronic device comprising thin-film circuitry formed with separate semiconductor islands, in which a semiconductor film is patterned into the separate semiconductor islands at a surface of a polymer substrate, and in which the semiconductor film is subjected to an energy beam treatment while masking the polymer substrate against exposure to the energy beam by means of a masking layer on a first insulating layer on said surface, characterised by the steps of:

(a) pre-shrinking the polymer substrate by prolonged heating at a temperature below the maximum usable temperature for the polymer material of the substrate, (b) thereafter depositing sequentially the first insulating layer and the masking layer, the first insulating layer being deposited on the pre-shrunk polymer substrate at a lower temperature than the prolonged heating temperature of step (a), the masking layer being deposited on the first insulating layer as a continuous layer over the whole of said surface, (c) subjecting the semiconductor film to the energy beam treatment while the masking layer is present as the continuous layer over the whole of said surface of the polymer substrate, and (d) thereafter removing the masking layer and the first insulating layer from most of said surface of the polymer substrate except where the separate semiconductor islands of the semiconductor film are present.

2. A method as claimed in claim 1, further characterised in that the semiconductor film is deposited on the first insulating layer to form the masking layer, is continuous over the whole of said surface of the polymer substrate during the energy beam treatment step (c) and has a thickness larger than the absorption depth of the energy beam in the semiconductor material.

3. A method as claimed in claim 1, further characterised in that the step (b) comprises sequentially depositing the first insulating layer, the masking layer, a second insulating layer and the semiconductor film on the polymer substrate, and the step (d) comprises removing the second insulating layer, the masking layer, and the first insulating layer from most of said surface of the polymer substrate except where covered by the separate semiconductor islands of the semiconductor film.

4. A method as claimed in claim 3, further characterised in that the second insulating layer is deposited at a higher temperature than the first insulating layer.

5. A method as claimed in claim 3 or claim 4, further characterised in that the masking layer is of metal which reflects the incident energy beam in step (c).

6. A method as claimed in claim 3 or claim 4, further characterised in that the masking layer is of a semiconductor material which absorbs the incident energy beam in step (c) and has a thickness larger than the absorption depth of the energy beam in the semiconductor material.

7. A method as claimed in claim 6, further characterised in that the masking layer is of the same semiconductor material as the semiconductor film and is deposited at a lower temperature and to a larger thickness than the semiconductor film.

8. A method as claimed in claim 3, further characterised in that the masking layer and the second insulating layer are deposited at a temperature which does not exceed the prolonged heating temperature of step (a).

9. A method as claimed in claim 1, further characterised in that the semiconductor film is a continuous film over the said surface of the polymer substrate during the energy beam treatment step (c), and areas of the semiconductor film are etched away to form the separate semiconductor islands after the energy beam treatment step (c).

10. A method as claimed in claim 3, further characterised in that areas of the semiconductor film are etched away to form the separate semiconductor islands before the energy beam treatment step (c).

11. A method as claimed in claim 1, further characterised in that the masking layer absorbs the incident energy beam in step (c) and is heated thereby to a temperature higher than the prolonged heating temperature of step (a), and the first insulating layer acts as a thermal barrier between the polymer substrate and the heated masking layer to maintain the temperature of the polymer substrate in step (c) below the prolonged heating temperature of step (a).

* * * * *